United States Patent [19]

Govaert

[11] Patent Number: 4,590,368
[45] Date of Patent: May 20, 1986

[54] DIGITAL GAIN ADJUSTER CIRCUIT FOR PHOTOMULTIPLIER TUBES

[75] Inventor: Johan A. Govaert, Peabody, Mass.

[73] Assignee: Baird Corporation, Bedford, Mass.

[21] Appl. No.: 468,579

[22] Filed: Feb. 22, 1983

[51] Int. Cl.[4] .............................................. H01J 40/14
[52] U.S. Cl. ............................. 250/207; 250/214 AG; 250/366
[58] Field of Search ............ 250/207, 214 AG, 363 S, 250/366; 328/173, 243

[56] References Cited

U.S. PATENT DOCUMENTS

| | | |
|---|---|---|
| 3,557,373 | 1/1971 | Hess .............................. 250/214 AG |
| 3,714,441 | 1/1973 | Kreda ........................... 250/214 AG |
| 3,988,590 | 10/1976 | Johnson ............................... 250/207 |

OTHER PUBLICATIONS

W. W. Hardin, "Automatic Gain Control", IBM Technical Disclosure Bulletin, vol. 4, No. 12, May 1962, p. 84.

Brecke et al., "Automatic Gain Control for Photomultiplier Tubes", IBM Technical Disclosure Bulletin, vol. 17, No. 7, Dec. 1974; pp. 2077-2078.

Primary Examiner—Edward P. Westin
Attorney, Agent, or Firm—Morse, Altman & Dacey

[57] ABSTRACT

A gain adjuster circuit is disclosed for adjusting the gain of a plurality of photomultiplier tubes (PMT's) by digital circuitry. The circuit includes a plurality of PMT's, each having a specific internal resistance. A plurality of switches and resistances are connected in series with the PMT's. The digital circuitry is designed for adjusting the effective resistances thereof, to adjust thereby the voltage across each of the several PMT's. Preferably, the digital circuitry includes a demultiplexer coupled, via the switches and resistances, to the PMT's, a flip-flop coupled to the demultiplexer, and a presettable counter coupled to the flip-flop.

10 Claims, 3 Drawing Figures

DIGITAL GAIN ADJUSTER CIRCUIT FOR PHOTOMULTIPLIER TUBES

BACKGROUND OF THE INVENTION

1. Field of the Invention

The present invention relates generally to gain adjuster circuits and, more particularly, to a gain adjuster circurt for adjusting the gain for a plurality of photomultiplier tubes in one system.

2. The Prior Art

There are a variety of instruments which use photomultiplier tubes (PMT's). Some of these instruments include gamma-cameras, ct scanners, spectrum analysers and the like. One specific radioactivity distribution system employing a plurality of PMT's is disclosed in my prior U.S. Pat. No. 4,267,452 assigned to a common assignee, which patent is incorporated herein by reference.

A photomultiplier tube (PMT) is a device which employs secondary emission from solids to produce current amplification. The PMT has one or more dynodes between its photocathode and its output electrode. The bombarding electrons initiating a cascade among the dynodes are due to photo-emission, i.e., the emission of electrons from a substance forming the photocathode by subjecting it to electromagnetic radiation such as light, X-rays and the like. The number of secondary electrons released depends upon the kinetic energy of the primary (the bombarding) electrons and, therefore, upon the voltage whereby the primary electrons are accelerated. Thus, PMT's are highly voltage sensitive. The gain of a PMT changes very rapidly with a relatively small change in the applied voltage across the PMT.

In a system employing a plurality of PMT's, the adjustment of the gain of these PMT's is effected by adjusting the individual voltages for each PMT. Originally, the adjustment of the voltage for each PMT was done by manually adjusting a potentiometer associated with each PMT. A later method uses a digital to analog converter to adjust the voltage for each PMT. The digital to analog converter receives its input from an external controller, such as a microprocessor.

Each of the above two methods is less than desirable and both are cumbersome and expensive, particularly so when the system uses a large number of PMT's. A need exists, therefore, for a simple method to adjust the voltage for each PMT in a system employing a plurality of PMT's.

SUMMARY OF THE INVENTION

It is a principal object of the present invention to overcome the above disadvantages by providing a simple yet reliable adjuster circuit for adjusting the gain of a plurality of photomultiplier tubes (PMT's) used in one system.

More specifically, it is an object of the present invention to provide a gain adjuster circuit for adjusting the gain of each of a plurality of PMT's by simple digital means. The gain adjuster circuit of the invention comprises a plurality of PMT's, with each having a specific internal resistance, a plurality of switches and resistances series coupled in series to the PMT's, and digital means coupled to the plurality of switches for adjusting the plurality of effective resistances of each of the plurality of PMT's, adjusting thereby the voltage, and thus the gain, across each of the PMT's. Preferably, the digital means includes a demultiplexer coupled to the PMT's, a flip-flop coupled to the demultiplexer, and a presettable counter coupled to the flip-flop to change the state thereof after a predetermined time interval as set by a signal developed for each of the PMT's and coupled to the presettable counter. Preferably, the plurality of switches comprise transistors.

Other and further objects of the present invention will in part be obvious and will in part appear hereinafter.

The invention accordingly comprises the gain adjuster circuit of the present disclosure, its components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENT

Figure 1:
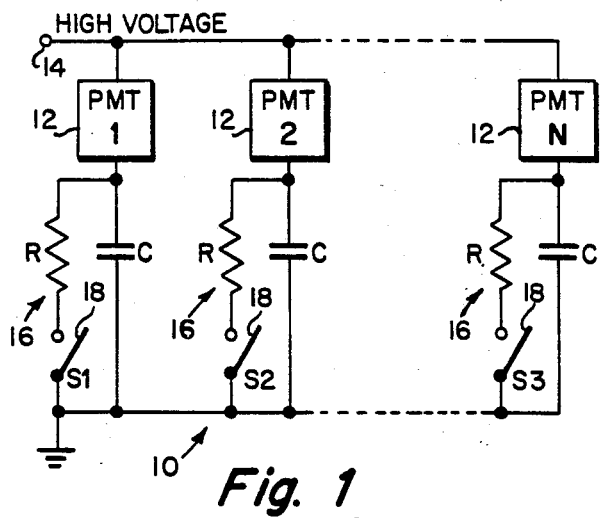
FIG. 1 is a schematic of a gain adjuster circuit according to the invention and helpful in understanding the principle underlying the invention.
Figure 2:
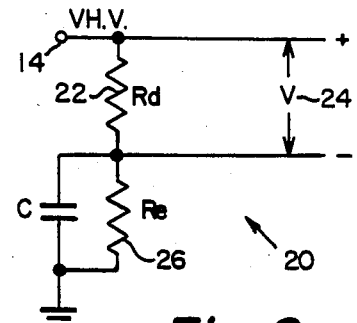
FIG. 2 is an equivalent circuit of a part of the circuit of FIG. 1, when S1 is closed.

The principle underlying the invention may best be explained with reference to FIG. 1 showing a simple schematic of a gain adjuster circuit 10. The gain adjuster circuit 10 of FIG. 1 includes a plurality of photomultiplier tubes (PMT's) 12 connected to a source of high voltage 14, resistance-capacitance (R-C) circuits 16 also connected to the PMT's 12 and ground, and a plurality of normally open switches 18. An equivalent circuit 20 of a part of the circuit 10 of FIG. 1, is illustrated in FIG. 2. The equivalent circuit 20 also is connected between the high voltage 14 and ground. A specific internal resistance 22 (Rd) of one PMT is representative of the dynode strings resistance of that PMT, across which resistance 22 the voltage (V) 24 is to be adjusted. By adjusting the voltage (V) 24, the gain of the particular PMT also will be adjusted. This adjustment is effected, according to the invention, by a simple digital method since the underlying principle of the invention is itself digital.

Referring to FIG. 1, if the capacitors (C) have a large enough selected value, then there will always be a constant d.c. voltage across the PMT's 12, even if the switches 18 are switched "on" and "off" periodically. In FIG. 2, the effective resistance 26 (Re) in series with the specific internal dynode string resistance 22 (Rd) of that particular PMT, when the switch 18 (S1) is continuously being cycled closed and open, is given by the equation:

$$Re = \frac{T}{Tc} Rd \qquad \text{Equation 1}$$

where T is the total cycle time and Tc denotes the time during which the switch 18 (S1) remains closed during that particular cycle. It is thus apparent that a change in Tc will bring about a change in Re, and consequently also in the voltage across the PMT. This change in the voltage across the Pmt (Vpmt) is even more readily apparent from the following equation:

$$Vpmt = \frac{Rd}{Rd + Re} \times V_{H.V.} \qquad \text{Equation 2}$$

which equation may be re-written as follows with Equation 1 substituted for Re:

$$Vpmt = \frac{Rd}{Rd + \frac{T}{Tc} Rd} \times V_{H.V.} \qquad \text{Equation 3}$$

The above Equations 2 and 3 indicate that the voltage across a PMT remains constant and stable as long as the applied voltage ($V_{H.V.}$) and the ratio T/Tc remain constant. It is further evident that the total cycle time (T) can vary without having any effect on the voltage across the PMT (Vpmt).

Figure 3:
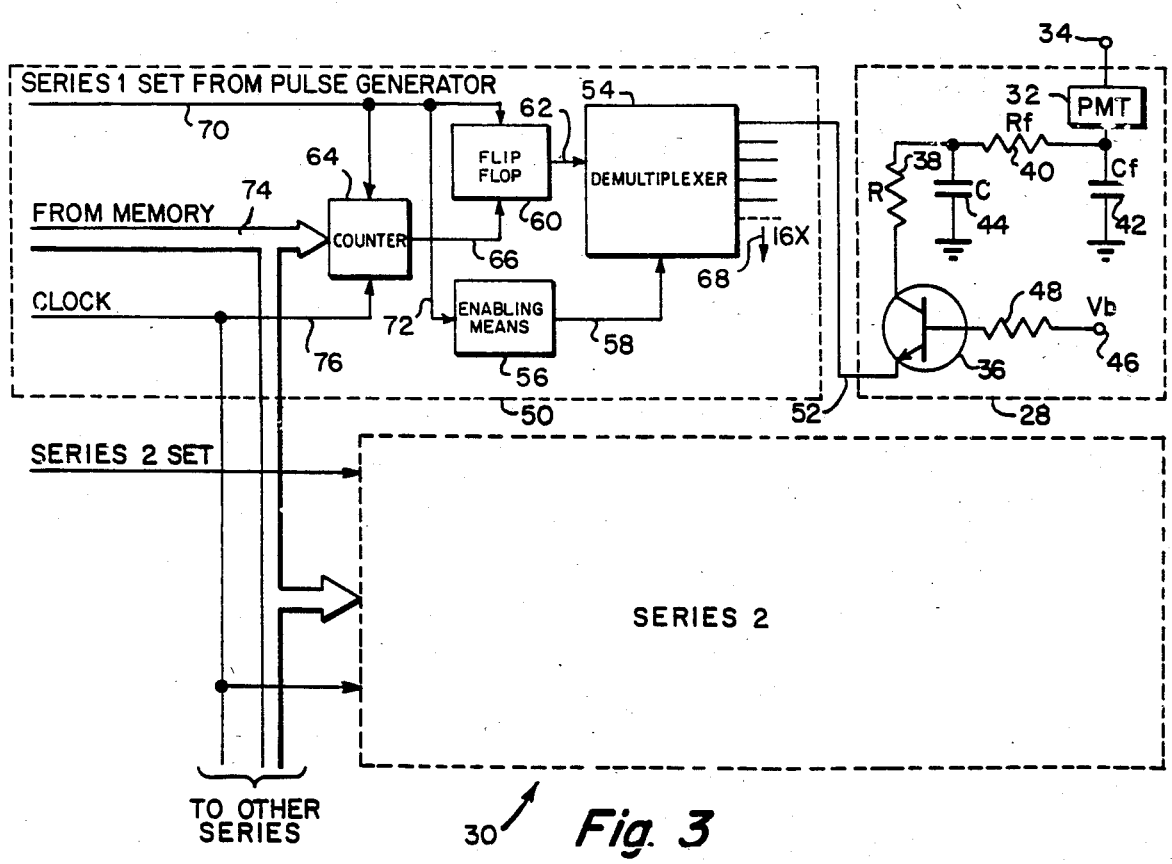
FIG. 3 is a schematic of a gain adjuster circuit according to the invention for adjusting the gain of a plurality of photomultiplier tubes (PMT's).

In FIG. 3 is shown a schematic of a gain adjuster circuit 30 for adjusting the gain of a plurality of PMT's by utilizing the principle above described. The gain adjuster circuit 30 is shown designed for adjusting the gain of sixteen PMT's per series. On the average, there are four such series of PMT's per one gain adjuster circuit 30, making for a total of sixty-four PMT's altogether whose gains are so adjusted. Only the first of such series will be described in detail, it being understood that the succeeding series function in like fashion.

The gain adjuster circuit 30 includes the PMT's, as mentioned sixteen per series, only one PMT 32 of which is illustrated. The PMT 32 is shown coupled to a source 34 of high voltage. This PMT 32, like all other PMT's has its own specific internal resistance (Rd) as determined by its dynode strings. A switch 36, preferably a transistor such as an NPN transistor, and a resistance (R) 38 are connected in series with the PMT 32. Preferably, a filter circuit comprising a filter resistor (Rf) 40 and a filter capacitor (Cf) 42 also are added, as shown, so as to make it possible to use a smaller value for the capacitor (C) 44 than would otherwise be possible. It will be recalled that the selected value of the capacitor (C) in FIG. 1 should be large enough so as to impress a constant d.c. voltage across the PMT. One set of preferred values for the circuitry 28 just described with reference to FIG. 3 is as follows: R 38=47 K ohms; Rf=1 megohms; and for both Cf42 and C44=0.01 farad. The base of the transistor switch 36 is connected to a base bias voltage (Vb) 46 through a base current limiting resistor 48 such that the transistor switch 36 is normally "off", i.e., non-conducting. In the illustrated circuitry 28, the preferred values are: Vb 46=2.1 V and resistor 48=680 ohms. The PMT 32 of the above described circuitry 28 is adjusted by digital means 50 coupled to the transistor switch 36 via a lead 52. As mentioned, this digital means 50 is designed for adjusting the effective resistance Re (calculated value, see FIG. 2) and thus the voltage (Vpmt) across the PMT 32 by setting the time period (Tc) during which the transistor switch 36 is conducting. The digital means 50 effects this gain adjustment of the Pmt 32 by a relatively simple yet very effective digital method hereinafter to be described.

The digital means 50 essentially comprises a demultiplexer 54, means 56 coupled to the demultiplexer 54 via lead 58 for selectively enabling a specific output of the demultiplexer 54 to be coupled to the circuitry 28 of the PMT 32 via the lead 52, a flip-flop 60 also coupled to the demultiplexer 54 via lead 62 to make that specific output of the demultiplexer 54 assume a logical low value, and a presettable counter 64 coupled to the flip-flop 60 via a lead 66 to change the state thereof, as hereinafter more fully described. Preferably, the enabling means 56 is a four-bit counter.

It must be pointed out that the transistor switch 36 of the circuitry 28 is and remains biased off by the base bias voltage (Vb) 46 as long as the specific output of the demultiplexer 54 coupled thereto via the lead 52 is at a logical high value. Conversely, where that specific output of the demultiplexer 54 is caused to assume a logical low value by an output signal of the flip-flop 60 transmitted thereto via the lead 62, the transistor switch 36 will be turned "on", i.e., rendered conductive. The transistor switch 36, rendered conductive, will remain "on" for as long the specific output of the demultiplexer 54 on the lead 52 remains at this logical low value. It will be remembered that this time period during which the transistor switch 36 is conducting is represented by the symbol Tc in the above described equations, explaining the principle underlying the invention.

It will be appreciated that the demultiplexer 54 is a sixteen bit demultiplexer designed to be coupled selectively, such as seriatim, to sixteen different circuitries as representatively described with reference to the circuitry 28. This is represented by the symbol "16x" noted against an arrow 68 in FIG. 3.

In operation, the gain adjuster circuit 30 for adjusting the gain of a plurality of PMT's by digital means works as follows. A short duration pulse, identified in FIG. 3 as "Series 1 Set" and generated by a pulse generator, not shown, is coupled via a lead 70 and a lead 72 to the enabling means 56, the four-bit counter, thereby advancing the same so as to enable the output of the demultiplexer 54 to be coupled to the circuitry 28 via the lead 52. Simultaneously, the short duration pulse, the "Series 1 Set", also is coupled via the lead 70 to the flip-flop 60, changing the state thereof and coupling its changed output via the lead 62 to the demultiplexer 54. This changed output of the flip-flop 60 causes that specific output of the demultiplexer 54 coupled via the lead 52 to the circuitry 28 to assume a logical low value, rendering thereby the transistor switch 36 conductive. The short duration pulse on lead 70 also sets the presettable counter 64 in accordance with a signal, generated by a memory circuit, not shown but indicated by the legend "FROM MEMORY", which is coupled via a lead 74 to the presettable counter 64. This signal, which represents a specific number N, is different for each of the plurality of PMT's whose gain is to be adjusted by the gain adjuster circuit 30. The signal, i.e., the respective number N, specific for the PMT 32 of the circuitry 28, determines how many clock pulses, generated by a clock, not shown but identified by the legend "CLOCK", and coupled via a lead 76 to the presettable counter 64, are needed before the most significant bit output of the presettable counter 64, coupled via the lead 66 to the flip-flop 60, will cause the flip-flop 60 again to change its state. Thus, the number of these clock pulses as determined by the specific representative signal from the memory, being representative of a specific number N, determines the precise time interval (Tc) during which the specific transistor switch 36 of the circuitry 28 is conductive. As mentioned, this time interval (Tc) determines the effective resistance (Re) of the resistor (R) 38 and thereby the voltage (Vpmt)

across that specific PMT 32. By doing so, it effectively adjusts the high voltage gain of that specific PMT 32, please note the discussion with respect to the Equations 1, 2, and 3 above. With the flip-flop having changed its state, its output on lead 62 to the demultiplexer 54 has been turned off. This in turn will make the specific output of the demultiplexer 54 once again assume a logical high value. This logical high value is coupled via lead 52 to the transistor switch 36 and then returns the same to a non-conductive state.

As mentioned, the memory supplies a different signal, representative of a different specific number N, for each PMT coupled to the gain adjuster circuit 30. Initially, each of these plurality of signals generated by the memory, will have been empirically determined for each of the plurality of PMT's coupled to the gain adjuster circuit 30 and, once so determined, set in the memory for automatically to be used thereafter to effect such a gain adjustment. The result is a more reliable instrument, such as a gamma camera, a ct scanner, a spectrum analyser or the like, that incorporates such a gain adjuster circuit 30 constantly to adjust the individual voltages (Vpmt) across each one of its plurality of PMT's. And it achieves this simply and reliably by a simple digital method, above described.

With the gain of the first PMT 32 having been adjusted, as above described, a further short duration pulse, i.e., the next "Series 1 Set", is generated by the pulse generator and coupled via leads 70 and 72 to the enabling means 56, commencing thereby another cycle to adjust the gain of the next PMT coupled to the demultiplexer 54. In between these "Series 1 Set" pulses, the generator also generates a "Series 2 Set" pulse, and indeed a "Series 3 Set" pulse and a "Series 4 Set" pulse, initiating thereby, the adjustment of the gain of one by one in each series, each of the sixty-four PMT's connected in the system illustrated in FIG. 3. The memory will likewise generate on lead 74 the series of signals, representing a specific separate and distinct number N, for each of these PMT's to be loaded into the presettable counter of each of the series. It is pointed out that systems incorporating more or less than the sixty-four PMT's mentioned with reference to FIG. 3 can equally well be designed using the principle of the invention.

Thus it has been shown and described a gain adjuster circuit designed for adjusting the gain of a plurality of PMT's by digital means, which circuit satisfies the objects and advantages set forth above.

Since certain changes may be made in the present disclosure without departing from the scope of the present invention, it is intended that all matter described in the foregoing specification or shown in the accompanying drawings, be interpreted in as illustrative and not in a limiting sense.

What is claimed is:

1. A voltage gain adjuster circuit for photomultiplier tubes (PMT's) comprising:
   (a) a source voltage;
   (b) a plurality of PMT's arranged in a circuitry, each of said plurality of PMT's coupled to said voltage source to apply a voltage thereacross and having a specific internal resistance;
   (c) a plurality of switch means and a plurality of resistances, together forming a plurality of effective resistances coupled in series with said plurality of PMT's; and
   (d) digital means coupled to said plurality of switch means for adjusting said plurality of effective resistances for each of said plurality of PMT's, adjusting thereby the voltage across each of said plurality of PMT's.

2. The voltage gain adjuster circuit of claim 1 wherein said digital means includes a demultiplexer and means selectively to enable a specific output of said demultiplexer to be coupled to one of said plurality of PMT's, a flip-flop coupled to said demultiplexer to make said one specific output thereof assume a low value, and a presettable counter coupled to said flip-flop to change the state thereof after a predetermined time as set by a signal coupled to said presettable counter.

3. The voltage gain adjuster circuit of claim 2 wherein said signal is empirically determined for each of said plurality of PMT's.

4. The voltage gain adjuster circuit of claim 2 wherein said plurality of switch means comprise a plurality of transistors.

5. The voltage gain adjuster circuit of claim 2 wherein each of said plurality of effective resistances are determined by the duration of said signal.

6. The voltage gain adjuster circuit of claim 2 further including a memory coupled to said presettable counter for generating and coupling said signal to said counter.

7. The voltage gain adjuster of claim 2 wherein said plurality of switch means normally are non-conducting by the application thereto of a bias voltage.

8. The voltage gain adjuster of claim 2 further including a filter circuit connected between each of said plurality of effective resistances and said plurality of PMT's.

9. The voltage gain adjuster circuit of claim 2 further including means for generating a pulse simultaneously to activate both said demultiplexer and said flip-flop.

10. The voltage gain adjuster circuit of claim 9 wherein said means selectively enabling said specific output of said demultiplexer to be coupled to said one of said plurality of PMT's is a four-bit counter connected between said pulse generating means and said demultiplexer.

* * * * *